(12) United States Patent
Doris et al.

(10) Patent No.: US 9,812,571 B2
(45) Date of Patent: Nov. 7, 2017

(54) TENSILE STRAINED HIGH PERCENTAGE SILICON GERMANIUM ALLOY FINFETS

(71) Applicant: International Business Machines Corporation, Armonk, NY (US)

(72) Inventors: Bruce B. Doris, Slingerlands, NY (US); Pouya Hashemi, White Plains, NY (US); Alexander Reznicek, Troy, NY (US); Joshua M. Rubin, Albany, NY (US); Robin M. Schulz, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/871,042

(22) Filed: Sep. 30, 2015

(65) Prior Publication Data

US 2017/0092765 A1   Mar. 30, 2017

(51) Int. Cl.
*H01L 21/20* (2006.01)
*H01L 21/22* (2006.01)
*H01L 21/324* (2006.01)
*H01L 21/336* (2006.01)
*H01L 29/78* (2006.01)
*H01L 29/66* (2006.01)
*H01L 29/417* (2006.01)
(Continued)

(52) U.S. Cl.
CPC ...... *H01L 29/7848* (2013.01); *H01L 21/0245* (2013.01); *H01L 21/02318* (2013.01); *H01L 21/02381* (2013.01); *H01L 21/02532* (2013.01); *H01L 21/02664* (2013.01); *H01L 21/324* (2013.01); *H01L 21/823418* (2013.01); *H01L 29/165* (2013.01); *H01L 29/41791* (2013.01); *H01L 29/66545* (2013.01); *H01L 29/66795* (2013.01); *H01L 29/785* (2013.01); *H01L 29/7851* (2013.01); *H01L 21/0262* (2013.01); *H01L 29/7853* (2013.01)

(58) Field of Classification Search
CPC ............ H01L 29/66795; H01L 29/785; H01L 21/823431; H01L 27/0886; H01L 21/845; H01L 21/823821; H01L 27/0924
See application file for complete search history.

(56) References Cited

U.S. PATENT DOCUMENTS

| | | |
|---|---|---|
| 8,211,772 B2 | 7/2012 | Kavalieros et al. |
| 8,927,363 B2 | 1/2015 | Cheng et al. |
| (Continued) | | |

*Primary Examiner* — Victor A Mandala
*Assistant Examiner* — Regan J Rundio
(74) *Attorney, Agent, or Firm* — Scully, Scott, Murphy & Presser, P.C.; Louis J. Percello, Esq.

(57) ABSTRACT

A thermal mixing process is employed to convert a portion of a silicon germanium alloy fin having a first germanium content and an overlying non-doped epitaxial silicon source material into a silicon germanium alloy source structure having a second germanium content that is less than the first germanium content, to convert another portion of the silicon germanium alloy fin and an overlying non-doped epitaxial silicon drain material into a silicon germanium alloy drain structure having the second germanium content, and to provide a tensile strained silicon germanium alloy fin portion having the first germanium content. A dopant is then introduced into the silicon germanium alloy source structure and into the silicon germanium alloy drain structure.

13 Claims, 6 Drawing Sheets

(51) Int. Cl.
  *H01L 21/02*    (2006.01)
  *H01L 21/8234* (2006.01)
  *H01L 29/165*   (2006.01)
  *H01L 29/06*     (2006.01)
  *H01L 29/161*    (2006.01)

(56) References Cited

U.S. PATENT DOCUMENTS

| | | | |
|---|---|---|---|
| 8,987,069 B1 | 3/2015 | Adam et al. | |
| 9,634,142 B1* | 4/2017 | Schepis | H01L 29/7848 |
| 2004/0242006 A1* | 12/2004 | Bedell | H01L 21/02381 |
| | | | 438/692 |
| 2011/0024804 A1* | 2/2011 | Chang | H01L 29/165 |
| | | | 257/288 |
| 2012/0056245 A1* | 3/2012 | Kang | H01L 21/0245 |
| | | | 257/192 |
| 2012/0091528 A1* | 4/2012 | Chang | H01L 29/7848 |
| | | | 257/347 |
| 2012/0241818 A1 | 9/2012 | Kavalieros et al. | |
| 2013/0264639 A1 | 10/2013 | Glass et al. | |
| 2014/0030876 A1 | 1/2014 | Flachowsky et al. | |
| 2014/0170839 A1 | 6/2014 | Brunco | |
| 2014/0183605 A1* | 7/2014 | Mochizuki | H01L 29/785 |
| | | | 257/288 |
| 2014/0306297 A1* | 10/2014 | Ching | H01L 29/66795 |
| | | | 257/401 |
| 2015/0069465 A1 | 3/2015 | Cheng et al. | |
| 2015/0108572 A1 | 4/2015 | Cheng et al. | |
| 2015/0228501 A1* | 8/2015 | Bedell | H01L 21/324 |
| | | | 438/151 |

\* cited by examiner

TENSILE STRAINED HIGH PERCENTAGE SILICON GERMANIUM ALLOY FINFETS

BACKGROUND

The present application relates to semiconductor technology, and more particularly to a method of forming a semiconductor structure containing a tensile strained high germanium content silicon germanium alloy fin portion located on an insulator layer and surrounded by a doped silicon germanium alloy source/drain structure having a germanium content that is less than that of the silicon germanium alloy fin portion. The present application also relates to a semiconductor structure that is formed by the method of the present application.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of complementary metal oxide semiconductor (CMOS) devices. Semiconductor FinFETs can achieve higher drive currents with increasingly smaller dimensions as compared to conventional planar FETs.

Silicon germanium alloy fins having from 25 atomic percent to 85 atomic percent germanium are front-up options for 10 nm and beyond technologies. Silicon germanium alloy fins having from 25 atomic percent to 50 atomic percent germanium are options only for 10 nm pFET devices. However, 7 nm technology is looking for silicon germanium alloy fins for both nFET and pFET devices. In some instances (for cost savings and easy processing), it is preferred to use the same channel material for both nFET and pFET devices. To gain the most out of the pFET device, the silicon germanium alloy has to have a high germanium content. Silicon germanium alloys having a high germanium percentage are not generally suitable for nFET devices. As such, there is a need for providing a method and structure in which silicon germanium alloy fins having a high germanium content can be used for both nFET and pFET devices.

SUMMARY

A thermal mixing process is employed to convert a portion of a silicon germanium alloy fin having a first germanium content and an overlying non-doped epitaxial silicon source material into a silicon germanium alloy source structure having a second germanium content that is less than the first germanium content, to convert another portion of the silicon germanium alloy fin and an overlying non-doped epitaxial silicon drain material into a silicon germanium alloy drain structure having the second germanium content, and to provide a tensile strained silicon germanium alloy fin portion having the first germanium content. A dopant is then introduced into the silicon germanium alloy source structure and into the silicon germanium alloy drain structure.

In one aspect of the present application, a method of forming a semiconductor structure is provided. In one embodiment of the present application, the method includes forming a gate structure straddling over a portion of a silicon germanium alloy fin having a first germanium content. Next, a non-doped epitaxial silicon source material is formed on a first side of the gate structure and a non-doped epitaxial silicon drain material is formed on a second side of the gate structure, the second side is opposite the first side. A thermal mixing process is then performed. The thermal mixing process converts a portion of the silicon germanium alloy fin and the non-doped epitaxial silicon source material into a silicon germanium alloy source structure having a second germanium content that is less than the first germanium content, converts another portion of the silicon germanium alloy fin and the non-doped epitaxial silicon drain material into a silicon germanium alloy drain structure having the second germanium content, and provides a tensile strained silicon germanium alloy fin portion having the first germanium content. A dopant is then introduced into the silicon germanium alloy source structure and into the silicon germanium alloy drain structure.

In another aspect of the present application, a semiconductor structure is provided. In one embodiment of the present application, the semiconductor structure includes a tensile strained silicon germanium alloy fin portion having a first germanium content. A doped silicon germanium alloy source structure having a second germanium content is located on one side of the tensile strained silicon germanium alloy fin portion, wherein the second germanium content is less than the first germanium content. A doped silicon germanium alloy drain structure having the second germanium content is located on another side of the tensile strained silicon germanium alloy fin portion.

DETAILED DESCRIPTION

Figure 1A:
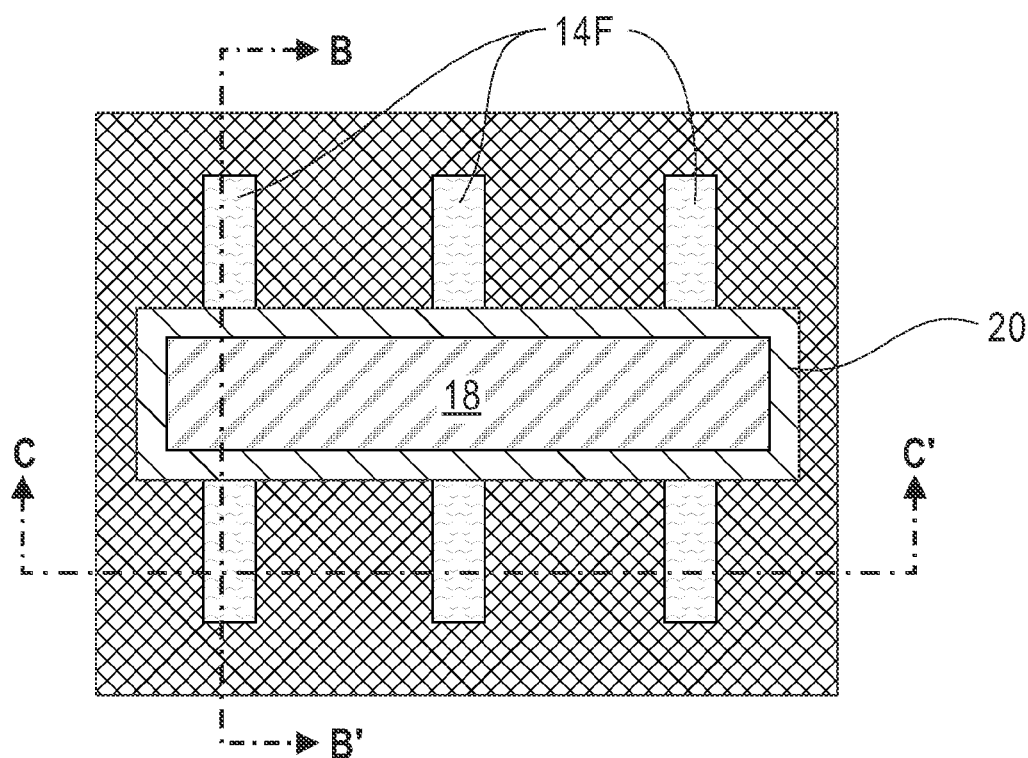
FIG. 1A is a top-down view of an exemplary semiconductor structure after forming a gate structure straddling over a portion of each silicon germanium alloy fin having a first germanium content that is present on a surface of an insulator layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
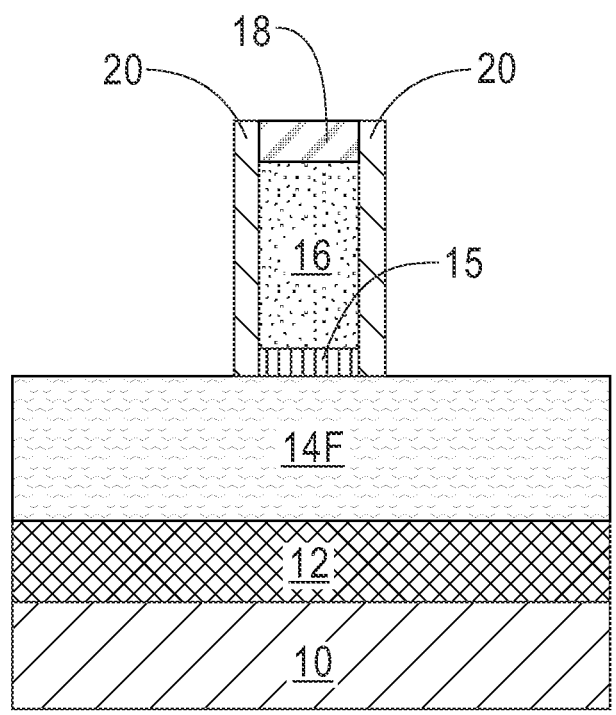
FIG. 1B is a cross sectional view of the exemplary semiconductor structure of FIG. 1A along vertical plane B-B'.
Figure 1C:
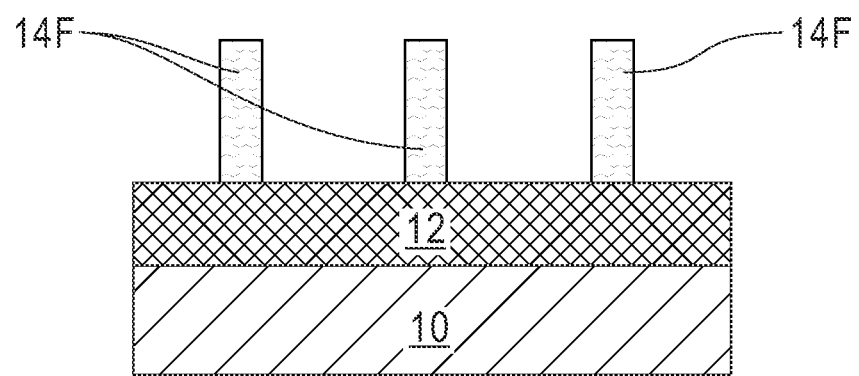
FIG. 1C is a cross sectional view of the exemplary semiconductor structure of FIG. 1A along vertical plane C-C'.

Referring first to FIGS. 1A-1C, there are illustrated various views of an exemplary semiconductor structure after forming a gate structure (15, 16, 18) straddling over a portion of each silicon germanium alloy fin 14F having a first germanium content that is present on a surface of an insulator layer 12 that can be employed in accordance with the present application. A gate spacer 20 may be present on sidewalls of the gate structure and straddling over other portions of the at least one silicon germanium alloy fin 14F.

In the present application, the cross section B-B' is through one of the silicon germanium alloy fins 14F illustrating a fin body region, while the cross section C-C' is located on a source side of the structure. The source side is located on one side of the gate structure, while the drain side is located on a side of the gate structure opposite the source side. The drain side would look similar to the source side.

The exemplary semiconductor structure shown in FIGS. 1A-1C can be formed by first providing a silicon germanium alloy-on-insulator (SGOI) substrate that includes, from bottom to top, a handle substrate 10, an insulator layer 12, and a silicon germanium alloy layer (not specifically shown) having the first germanium content; the silicon germanium alloy layer is subsequently patterned forming the silicon germanium alloy fins 14F shown in FIGS. 1A-1C. The handle substrate 10 provides mechanical support to the insulator layer 12 and the silicon germanium alloy layer. In some embodiments of the present application, the handle substrate 10 can be omitted.

The first germanium content of the silicon germanium alloy layer can be greater than 40 atomic percent germanium. In one example, the first germanium content of the silicon germanium alloy layer can from 50 atomic percent germanium up to, and including 80 atomic percent germanium.

In some embodiments of the present application, the handle substrate 10 may comprise a semiconductor material. The term "semiconductor" as used herein in connection with the semiconductor material of the handle substrate 10 denotes any semiconducting material including, for example, Si, Ge, SiGe, SiC, SiGeC, III/V compound semiconductors or II-VI compound semiconductors. Multilayers of these semiconductor materials can also be used as the semiconductor material of the handle substrate 10. In one embodiment, the handle substrate 10 comprises silicon. In some embodiments, the handle substrate 10 is a non-semiconductor material including, for example, a dielectric material and/or a conductive material.

The handle substrate 10 and the silicon germanium alloy layer may have the same or different crystal orientation. For example, the crystal orientation of the handle substrate 10 and/or the silicon germanium alloy layer may be {100}, {110}, or {111}. Other crystallographic orientations besides those specifically mentioned can also be used in the present application. The handle substrate 10 may be a single crystalline semiconductor material, a polycrystalline material, or an amorphous material. Typically, the silicon germanium alloy layer is a single crystalline silicon germanium alloy.

The insulator layer 12 may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride.

The SGOI substrate may be formed utilizing standard processes well known to those skilled in the art. In one example, the SGOI substrate can be formed by a layer transfer process. When a layer transfer process is employed, an optional thinning step may follow the bonding of two semiconductor wafers together. The optional thinning step reduces the thickness of the silicon germanium layer to a layer having a thickness that is more desirable. In another example, the SGOI substrate can be formed by first providing a silicon-on-insulator (SOI) substrate. A sacrificial silicon germanium alloy layer having a specific germanium content can then be epitaxially formed (i.e., grown or deposited) on the silicon layer of the SOI substrate. A thermal condensation process may then be performed to provide the SGOI substrate used in providing the exemplary semiconductor structure shown in FIGS. 1A-1C. Thermal condensation includes heating in an oxidizing ambient and at a temperature from 800° C. to 1300° C. The thermal condensation causes Ge diffusion from the sacrificial silicon germanium alloy into the silicon layer of the SOI layer thus converting the silicon layer into the silicon germanium alloy layer mentioned above.

In some embodiments, the thickness of silicon germanium alloy layer is from 10 nm to 100 nm. Other thicknesses that are lesser than, or greater than, the aforementioned thickness range may also be employed in the present application. The insulator layer 12 typically has a thickness from 1 nm to 200 nm. Other thicknesses that are lesser than, or greater than, the aforementioned thickness range may also be used as the thickness of the insulator layer 12. The thickness of the handle substrate 10 is inconsequential to the present application.

After providing the SGOI substrate, the silicon germanium alloy layer of the SGOI substrate is patterned to form at least one silicon germanium alloy fin 14F having the first germanium content. As is shown, each silicon germanium alloy fin 14F that is formed has a bottommost surface that is located on a topmost surface of insulator layer 12.

In one embodiment, the patterning process used to define the silicon germanium alloy fins 14F may include lithography and etching. Lithography includes forming a photoresist material (not shown) atop a material or material stack to be patterned; in the present application, the photoresist material is formed atop the silicon germanium alloy layer of the SGOI substrate. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the contiguous layer of hard mask material. The pattern provided by the patterned photoresist material is thereafter transferred into the underlying material layer or material layers (i.e., the silicon germanium alloy layer) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment, the patterning process may include a sidewall image transfer (SIT) process. The SIT process includes forming a mandrel material layer (not shown) atop the material or material layers (i.e., silicon germanium alloy layer) that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous semiconductor material, in the present case a silicon germanium alloy, and including a pair of vertical sidewalls that are parallel to each other. As used herein, a surface is "vertical" if there exists a vertical plane from which the surface does not deviate by more than three times the root mean square roughness of the surface. In one embodiment of the present application, each silicon germanium alloy fin 14F has a height that is from 10 nm to 100 nm and a width from 4 nm to 30 nm. Other heights and widths that are lesser than, or greater than the ranges mentioned herein can also be used in the present application. Each silicon germanium alloy fin 14F is spaced apart from its nearest neighboring silicon germanium alloy fin 14F by a pitch of from 20 nm to 100 nm. Also, each silicon germanium alloy fin 14F is oriented parallel to each other.

After forming the at least one silicon germanium alloy fin 14F, at least one gate structure (15, 16, 18) can be formed straddling over a portion of each silicon germanium alloy fin 14F. In some embodiments, each gate structure (15, 16, 18) is a functional gate structure. By "functional gate structure"

it is meant a permanent gate structure used to control output current (i.e., flow of carriers in the channel) of a semiconducting device through electrical or magnetic fields. Although a single functional gate structure is described and illustrated, a plurality of functional gate structures can be formed straddling over different portions of each silicon germanium alloy fin 14F. In some embodiments, each gate structure is used to provide an n-FinFET.

Each functional gate structure includes a gate material stack of, from bottom to top, a gate dielectric portion 15 and a gate conductor portion 16. In some embodiments, a gate cap portion 18 can be present atop each gate conductor portion 16.

The gate dielectric portion 15 of the functional gate structure comprises a gate dielectric material. The gate dielectric material that provides the gate dielectric portion 15 can be an oxide, nitride, and/or oxynitride. In one example, the gate dielectric material that provides the gate dielectric portion 15 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 15. In some embodiments, the gate dielectric portion 15 comprises a same gate dielectric material. In other embodiments, a first set of functional gate structures comprises a first gate dielectric material while a second set of functional gate structures comprises a second gate dielectric material that differs from the first gate dielectric material.

The gate dielectric material used in providing the gate dielectric portion 15 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 15 can have a thickness in a range from 1 nm to 10 nm. Other thicknesses that are lesser than, or greater than, the aforementioned thickness range can also be employed for the gate dielectric material.

The gate conductor portion 16 of the functional gate structure comprises a gate conductor material. The gate conductor material used in providing the gate conductor portion 16 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 16 comprises a same conductive material. In other embodiments, the gate conductor portion of a first set of functional gate structures comprises a different gate conductor material than a gate conductor portion of a second set of functional gate structures. For example, the gate conductor portion of a first set of functional gate structures may comprise an nFET gate metal, while the gate conductor portion of a second set of functional gate structures may comprise a pFET gate metal.

The gate conductor material used in providing the gate conductor portion 16 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 16 has a thickness from 1 nm to 100 nm. Other thicknesses that are lesser than, or greater than, the aforementioned thickness range can also be employed for the gate conductor material used in providing the gate conductor portion 16.

If present, the gate cap portion 18 of the functional gate structure comprises a gate cap material. The gate cap material that provides the gate cap portion 18 may include a hard mask material such as, for example, silicon dioxide, silicon nitride, and/or silicon oxynitride. The hard mask material that provides the gate cap portion 18 can be formed utilizing a conventional deposition process such as, for example, chemical vapor deposition or plasma enhanced chemical vapor deposition. The material that provides the gate cap portion 18 can have a thickness from 5 nm to 20 nm. Other thicknesses that are lesser than, or greater than, the aforementioned thickness range can also be employed as the thickness of the material that provides the gate cap portion 18.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

Figure 3A:
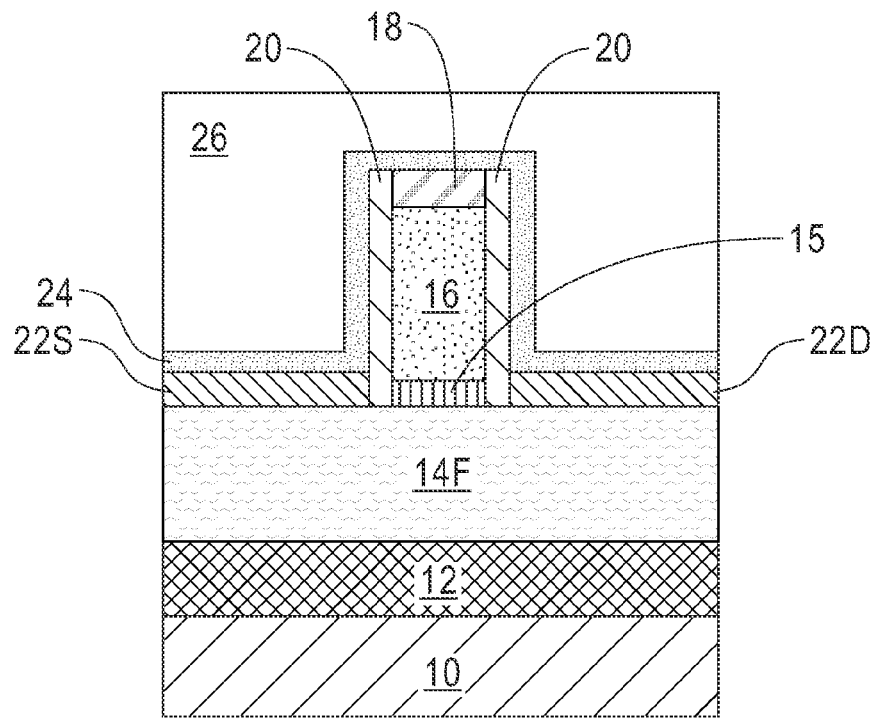
FIG. 3A is a cross sectional view of the exemplary semiconductor structure of FIG. 2A after formation of a dielectric liner material and an interlayer dielectric (ILD) material.
Figure 3B:
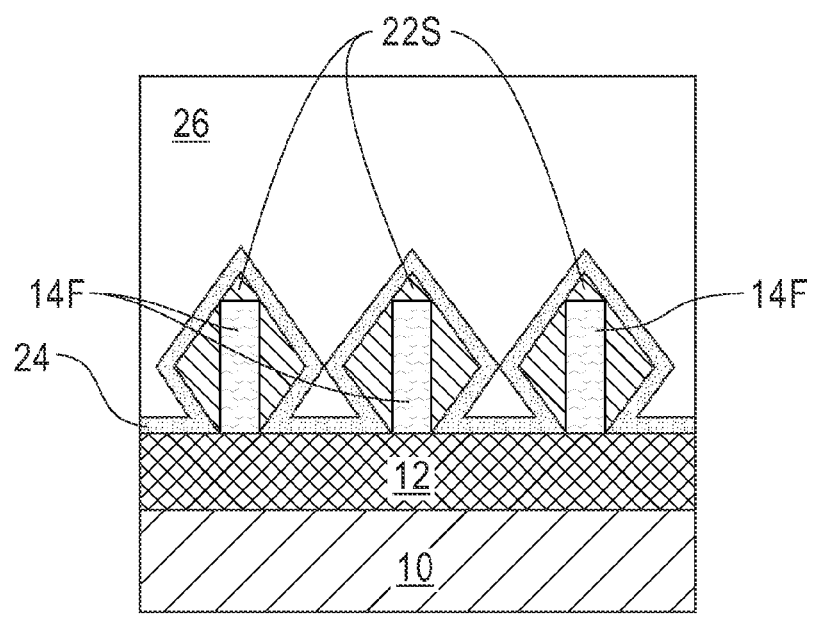
FIG. 3B is a cross sectional view of the exemplary semiconductor structure of FIG. 2B after formation of a dielectric liner material and an interlayer dielectric (ILD) material.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed; in the present application the sacrificial gate structure can be replaced with the functional gate structure anytime after the exemplary semiconductor structure shown in FIGS. 3A and 3B is formed.

In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), a gate spacer 20 can be formed on exposed sidewall surfaces of the respective gate structure (15, 16, 18) and straddling over other portions of the silicon germanium alloy 14F. The gate spacer 20 may comprise a spacer dielectric material such as, for example, silicon dioxide and/or silicon nitride. The gate spacer 20 can be formed by depositing a spacer material and thereafter a spacer etch can be performed.

Figure 2A:
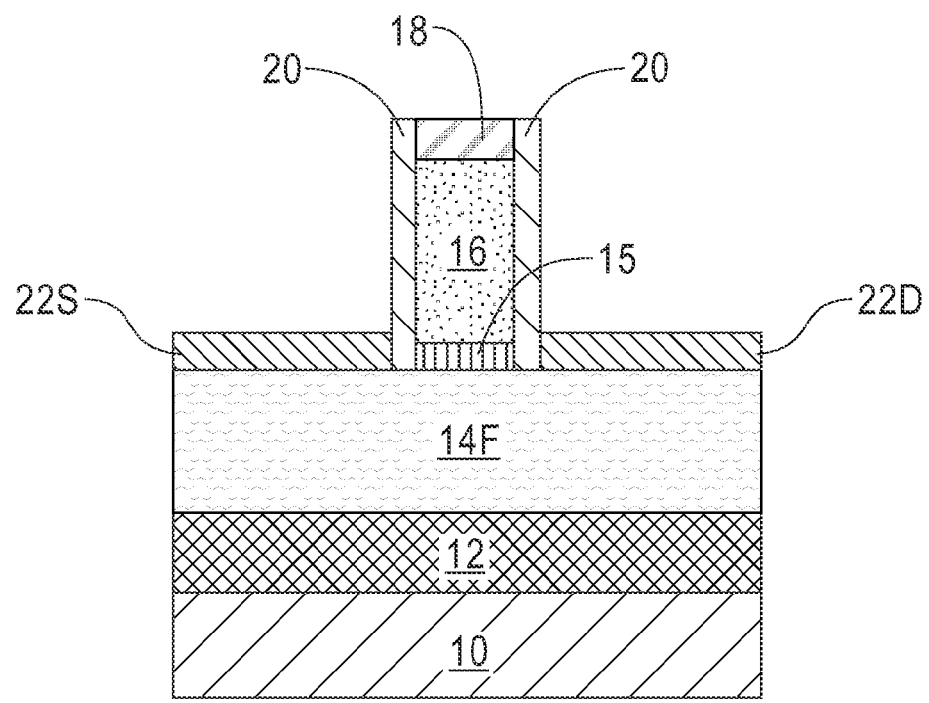
FIG. 2A is a cross sectional view of the exemplary semiconductor structure of FIG. 1B after formation of a non-doped epitaxial silicon source material on a first side of the gate structure and a non-doped epitaxial silicon drain material on a second side of the gate structure that is opposite the first side.
Figure 2B:
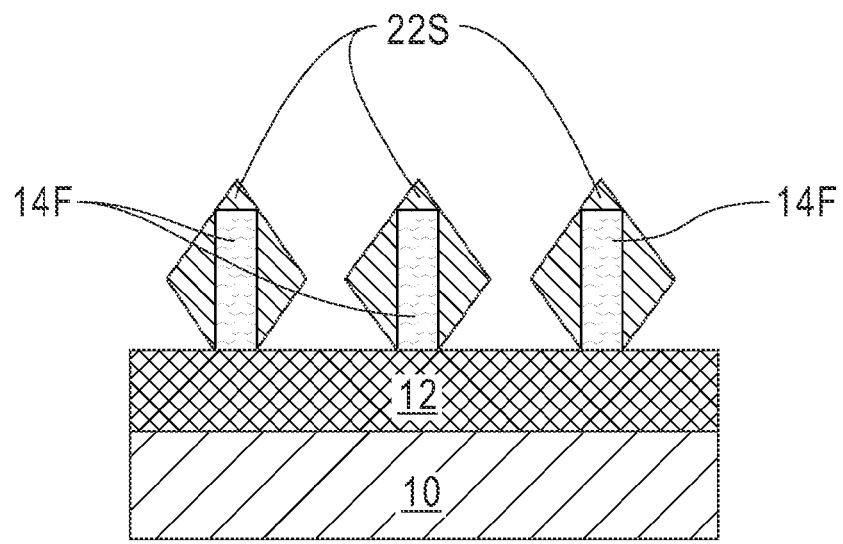
FIG. 2B is a cross sectional view of the exemplary semiconductor structure of FIG. 1C after formation of a non-doped epitaxial silicon source material on a first side of the gate structure.

Referring now to FIGS. 2A-2B, there are illustrated various views of the exemplary semiconductor structure of FIGS. 1B-1C after formation of a non-doped epitaxial silicon source material 22S on a first side of the gate structure (15, 16, 18) and a non-doped epitaxial silicon drain material 22D on a second side of the gate structure (15, 16, 18) that is opposite the first side. As is shown, the non-doped epitaxial silicon source material 22S is formed directly on exposed surfaces of the silicon germanium alloy fins 14F, while the non-doped epitaxial silicon drain material 22D is formed directly on other exposed surfaces of the silicon germanium alloy fins 14F. Notably, the non-doped epitaxial silicon source material 22S and the non-doped epitaxial silicon drain material 22D are formed on exposed portions (i.e., topmost surface and sidewall surfaces) of the silicon germanium alloy fin 14F that are not covered by the gate structure (15, 16, 18) and the gate spacer 20.

The non-doped epitaxial silicon source material 22S and the non-doped epitaxial silicon drain material 22D comprise pure silicon. The non-doped epitaxial silicon source material 22S and the non-doped epitaxial silicon drain material 22D can be formed by a selective epitaxial growth (or deposition) process; the term "selective" when used in conjugation with the phrase "selective epitaxial growth" denotes that the epitaxial material is grown only on semiconductor material surfaces not insulator or conductor surfaces. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the non-doped epitaxial silicon source material 22S and the non-doped epitaxial silicon drain material 22D have an epitaxial relationship with the underlying silicon germanium alloy fin 14F.

Examples of various epitaxial growth process apparatuses that are suitable for use in forming the non-doped epitaxial silicon source material 22S and the non-doped epitaxial silicon drain material 22D include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of the non-doped epitaxial silicon source material 22S and the non-doped epitaxial silicon drain material 22D. In some embodiments, the source gas for the deposition of the non-doped epitaxial silicon source material 22S and the non-doped epitaxial silicon drain material 22D includes a silicon containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Carrier gases like hydrogen, nitrogen, helium and argon can be used.

The non-doped epitaxial silicon source material 22S and the non-doped epitaxial silicon drain material 22D have non-planar surfaces. In some embodiments and as shown, the non-doped epitaxial silicon source material 22S and the non-doped epitaxial silicon drain material 22D are diamond-shaped. In some embodiments, each non-doped epitaxial silicon source material 22S within the source side of the exemplary semiconductor structure is separated from its nearest neighboring non-doped epitaxial silicon source material 22S by a gap. Likewise and in some embodiments, each non-doped epitaxial silicon drain source material 22D within the drain side of the exemplary semiconductor structure is separated from its nearest neighboring non-doped epitaxial silicon drain material 22D by a gap. In such embodiments, the each non-doped epitaxial silicon source material 22S is non-merged and each non-doped epitaxial silicon drain source material 22D is non-merged.

Referring now to FIGS. 3A-3B, there are illustrated the exemplary semiconductor structure of FIGS. 2A-2B after formation of a dielectric liner material 24 and an interlayer dielectric (ILD) material 26. As is shown, the dielectric liner material 24 is formed on exposed surfaces of the non-doped epitaxial silicon source material 22S, the non-doped epitaxial silicon drain material 22D, the gate spacer 20, and the gate gap portion 18. The ILD material 26 is formed on an exposed surface of the dielectric liner material 24.

The dielectric liner material 24 may include a dielectric material such as, for example, silicon dioxide, silicon nitride, and/or silicon oxynitride. Typically, the dielectric liner material 24 comprises a different dielectric material than the gate spacer 20. The dielectric material that provides the dielectric liner material 24 can be formed utilizing a conventional deposition process such as, for example, chemical vapor deposition or plasma enhanced chemical vapor deposition. The dielectric material that provides the dielectric liner material 24 can have a thickness from 5 nm to 20 nm. Other thicknesses that are lesser than, or greater than, the aforementioned thickness range can also be employed as the thickness of the material that provides the dielectric liner material 24.

The ILD material 26 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the ILD material 26 can be formed utilizing a deposition process including, for example, chemical vapor deposition (CVD), plasma enhanced chemical vapor deposition (PECVD), evaporation or spin-on coating. The thickness of the ILD material 26 that can be employed in the present application may vary so long as a topmost surface of the ILD material 26 is coplanar with, or above, a topmost surface of the gate structure (15, 16, 18). In one example, the ILD material 26 has a thickness from 80 nm to 500 nm.

Figure 4A:
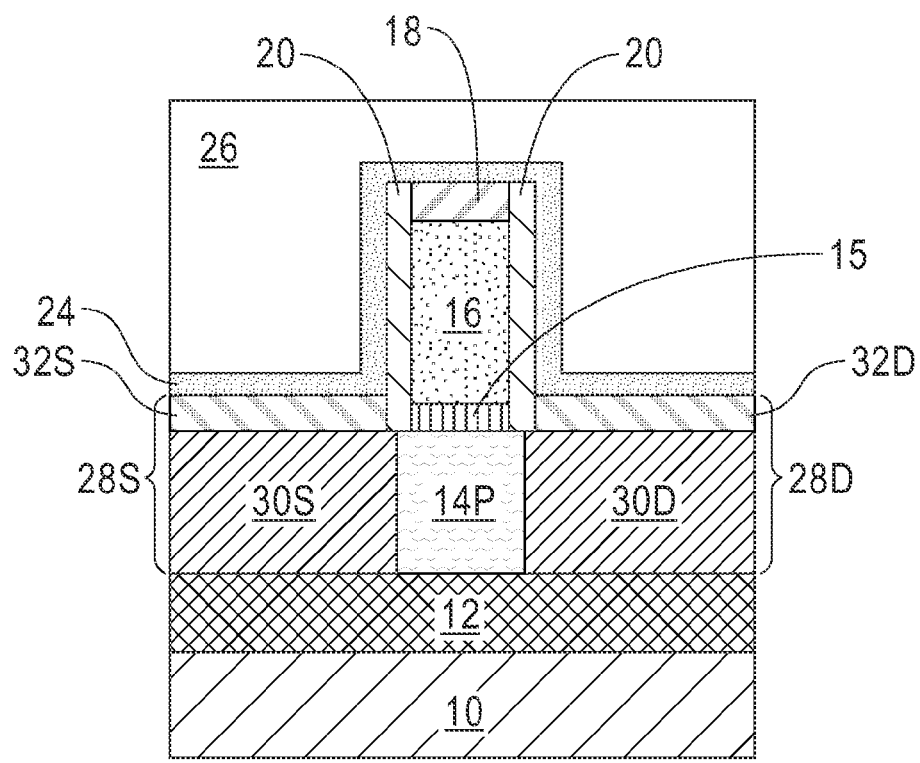
FIG. 4A is a cross sectional view of the exemplary semiconductor structure of FIG. 3A after performing a thermal mixing process to convert a portion of the silicon germanium alloy fin and the overlying non-doped epitaxial silicon source material into a silicon germanium alloy source structure having a second germanium content that is less than the first germanium content and to convert another portion of the silicon germanium alloy fin and the overlying non-doped epitaxial silicon drain material into a silicon germanium alloy drain structure having the second germanium content, and to provide a tensile strained silicon germanium alloy fin portion having the first germanium content.
Figure 4B:
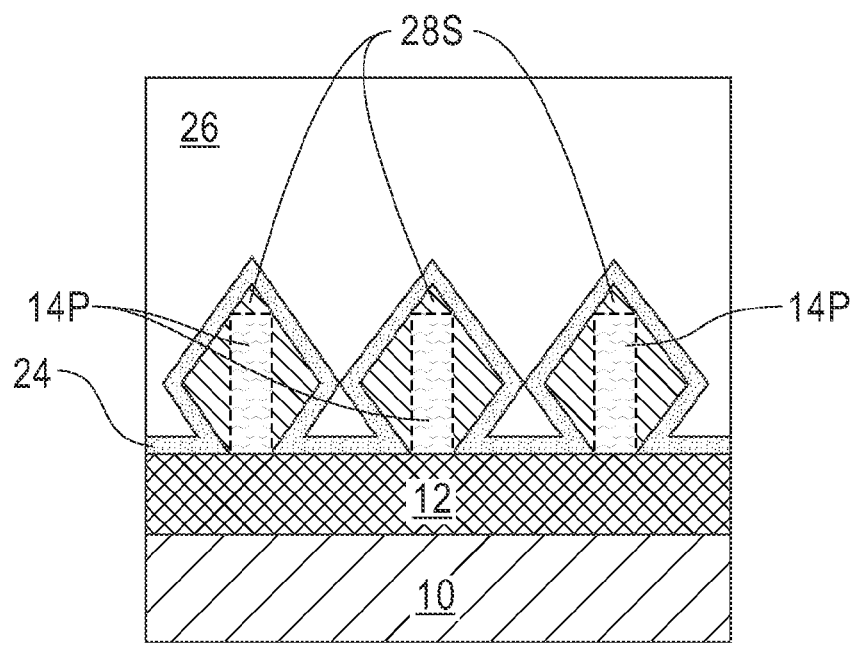
FIG. 4B is a cross sectional view of the exemplary semiconductor structure of FIG. 3B after performing a thermal mixing process to convert a portion of the silicon germanium alloy fin and the overlying non-doped epitaxial silicon source material into a silicon germanium alloy source structure having a second germanium content that is less than the first germanium content and to provide a tensile strained silicon germanium alloy fin portion having the first germanium content.

Referring now to FIGS. 4A-4B, there are illustrated the exemplary semiconductor structure of FIGS. 3A-3B after performing a thermal mixing process. The thermal mixing process converts a portion of the silicon germanium alloy fin 14F that is located on a source side of the gate structure (15, 16, 18) and the overlying non-doped epitaxial silicon source material 22S into a silicon germanium alloy source structure 28S having a second germanium content that is less than the first germanium content. The thermal mixing process further converts another portion of the silicon germanium alloy fin 14F that is located on a drain side of the gate structure and the overlying non-doped epitaxial silicon drain material 22D into a silicon germanium alloy drain structure 28D having the second germanium content. The thermal mixing process also provides a tensile strained silicon germanium alloy fin portion 14P having the first germanium content. In some embodiments, the silicon germanium alloy source and drain structures (28S, 28D) may be diamond-shaped.

The second germanium content of the silicon germanium alloy source and drain structures (28S, 28D) is typically below 27 atomic percent germanium. In one example, the second germanium content of the silicon germanium alloy source and drain structures (28S, 28D) can be from 15 atomic germanium to 25 atomic percent germanium. It is noted that silicon germanium alloys having a germanium content of less than 27 atomic percent will not relax during a subsequently performed ion implantation step. Also, silicon germanium alloys having a germanium content of less than 27 atomic percent ensure that a high strain is put on a portion of the silicon germanium alloy fin 14F that is located between the silicon germanium alloy source and drain structures (28S, 28D).

The silicon germanium alloy source structure 28S includes, from bottom to top, an embedded silicon germanium alloy source portion 30S of the second germanium content and a raised silicon germanium alloy source portion 32S of the second germanium content. The embedded silicon germanium alloy source portion 30S is located beneath a plane including the bottommost surface of the gate structure (15, 16, 18), while the raised silicon germanium alloy source portion 32S is located above the plane including the bottommost surface of the gate structure (15, 16, 18). In some embodiments of the present application, the second germanium content within the embedded silicon germanium alloy source portion 30S is the same as the second germanium content within the raised silicon germanium alloy source portion 32S. In yet another embodiment, the second germanium content within the embedded silicon germanium alloy source portion 30S is greater than or lesser than the second germanium content within the raised silicon germanium alloy source portion 32S.

The silicon germanium alloy drain structure 28D includes, from bottom to top, an embedded silicon germanium alloy drain portion 30D of the second germanium content and a raised silicon germanium alloy drain portion 32D of the second germanium content. The embedded silicon germanium alloy drain portion 30D is located beneath a plane including the bottommost surface of the gate structure (15, 16, 18), while the raised silicon germanium alloy drain portion 32D is located above the plane including the bottommost surface of the gate structure (15, 16, 18). In some embodiments of the present application, the second germanium content within the embedded silicon germanium alloy drain portion 30D is the same as the second germanium content within the raised silicon germanium alloy drain portion 32D. In yet another embodiment, the second germanium content within the embedded silicon germanium alloy drain portion 30D is greater than or lesser than the second germanium content within the raised silicon germanium alloy drain portion 32D.

As is shown, the tensile strained silicon germanium alloy fin portion 14P having the first germanium content has a first sidewall surface that directly contacts a sidewall surface of the embedded silicon germanium alloy source portion 30S, and a second sidewall surface that is opposite to the first sidewall surface that directly contacts a sidewall surface of the embedded silicon germanium alloy drain portion 30D. The tensile strained silicon germanium alloy fin portion 14P has a topmost surface that is coplanar with a topmost surface of both the embedded silicon germanium alloy source and drain portions (30S, 30D). The tensile strained silicon germanium alloy fin portion 14P is located directly beneath the gate structure (15, 16, 18) and it functions as the channel region (or body region) of the FinFET device of the present application.

The thermal mixing process of the present application may also be referred to as a thermal anneal process. During thermal annealing, Si atoms from the non-doped epitaxial silicon source material 22S and the non-doped epitaxial silicon drain material 22D diffuse into portions of the silicon germanium alloy fin 14F diluting those portions of the silicon germanium alloy fin 14F providing the embedded silicon germanium alloy source and drain portions (30S, 30D). Also, and during the thermal mixing, Ge atoms are diffused from the silicon germanium alloy fins 14F into the overlying non-doped epitaxial silicon source and drain materials (22S, 22D) adding Ge into the non-doped epitaxial silicon source and drain materials (22S, 22D). The added Ge converts the non-doped epitaxial silicon source and drain materials (22S, 22D) into the raised silicon germanium alloy source and drain portions (32S, 32D).

The thermal mixing process of the present application can be carried out in an inert ambient such as, for example, He, Ar and/or Ne. The thermal mixing process of the present application can be performed at a temperature from 800° C. to 1350° C. The thermal mixing process of the present application may include a furnace anneal, a rapid thermal anneal or any other anneal that can form the exemplary semiconductor structure shown in FIGS. 4A-4B. It is noted that if n-type dopants were present in the silicon germanium alloy fin 14F and the non-doped epitaxial silicon materials during the thermal mixing process, such dopants would short the device.

Figure 5A:
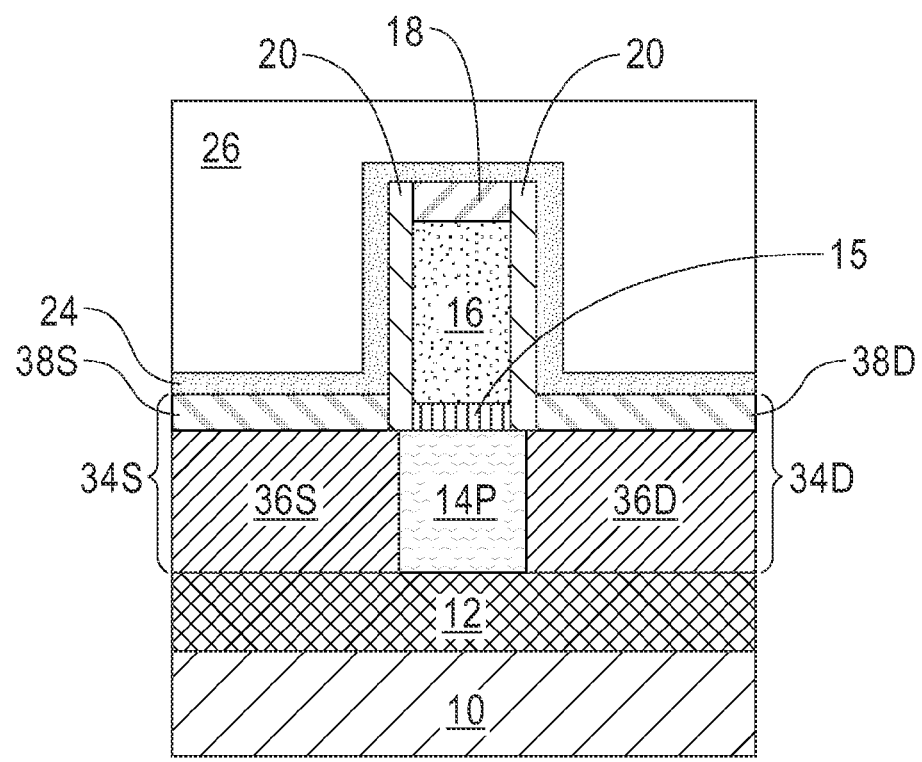
FIG. 5A is a cross sectional view of the exemplary semiconductor structure of FIG. 4A after introducing a dopant into the silicon germanium alloy source structure and into the silicon germanium alloy drain structure.
Figure 5B:
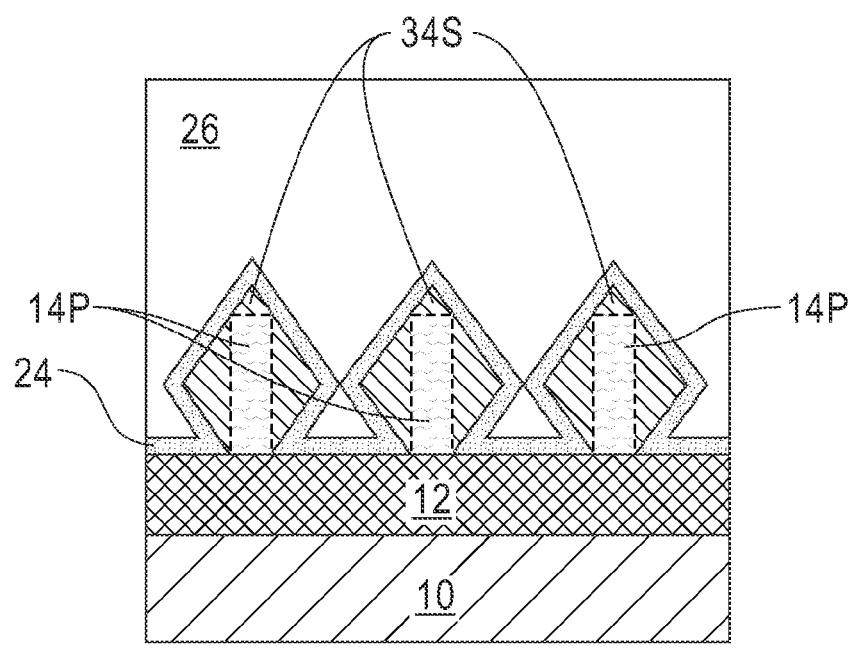
FIG. 5B is a cross sectional view of the exemplary semiconductor structure of FIG. 4B after introducing a dopant into the silicon germanium alloy source structure.

Referring now to FIGS. 5A-5B, there are illustrated the exemplary semiconductor structure of FIGS. 4A-4B after introducing a dopant into the silicon germanium alloy source structure 28S (including both the raised and embedded silicon germanium alloy source portions 30S, 32S) and into the silicon germanium alloy drain structure 28D (including both the raised and embedded silicon germanium alloy drain portions 30D, 32D). The silicon germanium alloy source structure 28S containing the dopant can be referred to herein as doped silicon germanium alloy source structure 34S, and the silicon germanium alloy drain structure 28D including the dopant may be referred to herein as a doped silicon germanium alloy drain structure 34D. In some embodiments of the present application, the doped silicon germanium alloy source and drain structures (34S, 34D) may be diamond-shaped.

The doped silicon germanium alloy source structure 34S has the second germanium content and includes, from bottom to top, a doped and embedded silicon germanium alloy source portion 36S and a doped and raised silicon germanium alloy source portion 38S. The doped and embedded silicon germanium alloy source portion 36S is located beneath a plane including the bottommost surface of the gate structure (15, 16, 18), while the doped and raised silicon germanium alloy source portion 38S is located above the plane including the bottommost surface of the gate structure (15, 16, 18). In some embodiments of the present application, the second germanium content within the doped and embedded silicon germanium alloy source portion 36S is the same as the second germanium content within the doped and raised silicon germanium alloy source portion 38S. In yet another embodiment, the second germanium content within the doped and embedded silicon germanium alloy source portion 30S is greater than or lesser than the second germanium content within the doped and the raised silicon germanium alloy source portion 32S.

The doped silicon germanium alloy drain structure 34D includes, from bottom to top, a doped and embedded silicon germanium alloy drain portion 36D of the second germanium content and a doped and raised silicon germanium alloy drain portion 38D of the second germanium content. The doped and embedded silicon germanium alloy drain portion 36D is located beneath a plane including the bottommost surface of the gate structure (15, 16, 18), while the doped and raised silicon germanium alloy drain portion 38D is located above the plane including the bottommost surface of the gate structure (15, 16, 18). In some embodiments of the present application, the second germanium content within the doped and embedded silicon germanium alloy drain portion 36D is the same as the second germanium content within the doped and raised silicon germanium alloy drain portion 38D. In yet another embodiment, the second germanium content within the doped and embedded silicon germanium alloy drain portion 36D is greater than or lesser than the second germanium content within the doped and raised silicon germanium alloy drain portion 38D.

The tensile strained silicon fin portion 14P, which is positioned between the doped and embedded silicon germanium alloy source and drain portions (36S, 36D), remains undoped. As is shown, the tensile strained silicon germanium alloy fin portion 14P has a first sidewall surface that contacts a sidewall surface of the doped and embedded silicon germanium alloy source portion 36S, and a second sidewall surface that is opposite the first sidewall surface that directly contacts the doped and embedded silicon germanium alloy drain portion 36D. The topmost surface of the tensile strained silicon germanium alloy fin portion 14P is coplanar with a topmost surface of both the doped and embedded silicon germanium alloy source and drain portions (36S, 36D). Also, the bottommost surface of the tensile strained silicon germanium alloy fin portion 14P is coplanar with a bottommost surface of both the doped and embedded silicon germanium alloy source and drain portions (36S, 36D).

The dopant that is introduced into the silicon germanium alloy source structure 28S (including both the raised and embedded silicon germanium alloy source portions 30S, 32S) and into the silicon germanium alloy drain structure 28D (including both the raised and embedded silicon germanium alloy drain portions 30D, 32D) may be an n-type dopant or a p-type dopant.

What is claimed is:

1. A method of forming a semiconductor structure, said method comprising:
    forming a gate structure straddling over a portion of a silicon germanium alloy fin having a first germanium content;
    forming a non-doped epitaxial silicon source material on a first side of said gate structure and a non-doped epitaxial silicon drain material on a second side of said gate structure, said second side is opposite said first side, wherein said non-doped epitaxial silicon source material is spaced apart from said non-doped epitaxial silicon drain material by an entirety of said gate structure;
    forming a dielectric liner material on said non-doped epitaxial silicon source and drain materials and surrounding and in direct contact with physically exposed surfaces of said gate structure prior to performing a thermal mixing process;
    performing said thermal mixing process, wherein said thermal mixing process converts a portion of said silicon germanium alloy fin and said non-doped epitaxial silicon source material into a silicon germanium alloy source structure having a second germanium content that is less than said first germanium content, converts another portion of said silicon germanium alloy fin and said non-doped epitaxial silicon drain material into a silicon germanium alloy drain structure having said second germanium content, and provides a tensile strained silicon germanium alloy fin portion having said first germanium content; and
    introducing a dopant into said silicon germanium alloy source structure and into said silicon germanium alloy drain structure.

2. The method of claim 1, further comprising forming an interlevel dielectric material on said dielectric liner material prior to said thermal mixing.

3. The method of claim 1, wherein said first germanium content is from 50 atomic percent germanium to 80 atomic percent germanium and said second germanium content is less than 27 atomic percent germanium.

4. The method of claim 1, wherein said doped silicon germanium alloy source structure comprises, from bottom to top, a doped and embedded silicon germanium alloy source portion and a doped and raised silicon germanium alloy source portion, and said doped silicon germanium alloy drain structure comprises, from bottom to top, a doped and embedded silicon germanium alloy drain portion and a doped and raised silicon germanium alloy drain portion.

5. The method of claim 4, wherein a sidewall surface of said doped and embedded silicon germanium alloy source portion directly contacts a first sidewall surface of said tensile strained silicon germanium alloy fin portion, and a sidewall surface of said doped and embedded silicon germanium alloy drain portion directly contact a second sidewall surface of said silicon germanium alloy fin portion.

6. The method of claim 5, wherein a topmost surface of said silicon germanium alloy fin portion is coplanar with a topmost surface of both said doped and embedded silicon germanium alloy source and drain portions, and wherein a bottommost surface of said silicon germanium alloy fin portion is coplanar with a bottommost surface of both said doped and embedded silicon germanium alloy source and drain portions.

7. The method of claim 1, wherein said introducing said dopant comprises ion implanting an n-type dopant.

8. The method of claim 1, wherein said silicon germanium fin is formed by:
provideing a substrate comprising a silicon germanium alloy layer having said first germanium content; and
patterning said silicon germanium alloy layer to provide said silicon germanium alloy fin.

9. The method of claim 1, wherein said gate structure is a functional gate or a sacrificial gate structure that is replaced with a functional gate structure after said thermal mixing process.

10. The method of claim 1, wherein said silicon germanium alloy source structure has a bottommost surface that is in direct physical contact with a first portion of a topmost surface of an insulator layer, and said silicon germanium alloy drain structure has a bottommost surface that is in direct physical contact with a second portion of said topmost surface of said insulator layer.

11. The method of claim 1, wherein said silicon germanium alloy fin is a single crystalline silicon germanium alloy, and said non-doped epitaxial silicon source material and said non-doped epitaxial silicon drain material are both composed of single crystalline silicon.

12. The method of claim 1, wherein said non-doped epitaxial silicon source material and said non-doped epitaxial silicon drain material have non-planar surfaces.

13. The method of claim 12, wherein said non-doped epitaxial silicon source material and said non-doped epitaxial silicon drain material are diamond-shaped.

* * * * *